United States Patent [19]

Alcorn et al.

[11] 4,172,004

[45] Oct. 23, 1979

[54] METHOD FOR FORMING DENSE DRY ETCHED MULTI-LEVEL METALLURGY WITH NON-OVERLAPPED VIAS

[75] Inventors: George E. Alcorn, Fairfax; Raymond W. Hamaker, Catharpin; Geoffrey B. Stephens, Catlett, all of Va.

[73] Assignee: International Business Machines Corporation, Armonk, N.Y.

[21] Appl. No.: 843,901

[22] Filed: Oct. 20, 1977

[51] Int. Cl.² .................................................. C23F 1/02
[52] U.S. Cl. ...................................... 156/643; 29/578; 29/591; 156/646; 156/652; 156/656; 156/659; 204/192 EC; 204/192 E; 357/71; 427/90
[58] Field of Search ................ 204/192 EC, 192 E; 156/643, 646, 652, 653, 656, 657, 659; 427/89, 90; 29/580, 578, 588, 590, 591; 357/65, 66, 71

[56] References Cited

U.S. PATENT DOCUMENTS

| | | | |
|---|---|---|---|
| 3,804,738 | 4/1974 | Lechaton et al. | 204/192 |
| 3,856,648 | 12/1974 | Fuller et al. | 204/192 |
| 3,868,723 | 2/1975 | Lechaton et al. | 357/54 |
| 3,880,684 | 4/1975 | Abe | 252/79.1 X |
| 3,881,971 | 5/1975 | Greer et al. | 427/90 X |
| 3,900,944 | 8/1975 | Fuller et al. | 427/89 X |
| 3,930,913 | 1/1976 | Jacob | 156/345 X |
| 3,951,709 | 4/1976 | Jacob | 252/79.2 X |
| 3,969,197 | 7/1976 | Tolar et al. | 204/192 EC |
| 3,994,793 | 11/1976 | Harvilchuck et al. | 204/192 |
| 4,076,575 | 2/1978 | Chang | 204/192 E |

OTHER PUBLICATIONS

IBM Technical Disclosure Bulletin, vol. 19, No. 11, Apr. 1977, Via Holes In Quartz Coatings by Sarkany et al., pp. 4152–4153.

*Primary Examiner*—William A. Powell
*Attorney, Agent, or Firm*—John E. Hoel

[57] ABSTRACT

A double level metal interconnection structure and process for making same are disclosed, wherein an etch-stop layer is formed on the first metal layer to prevent over-etching thereof when forming the second level metal line in a via hole in an insulating layer thereover, by means of reactive plasma etching. The etch-stop layer is composed of chromium and the reactive plasma etching is carried out with a halocarbon gas.

6 Claims, 20 Drawing Figures

SEC. A-A'

1. INITIAL PHOTORESIST PATTERN (1ST. METAL)

SEC. A–A'

2. AFTER PLASMA ETCH OF CR LAYER

SEC. A–A'

3. AFTER REACTIVE–ION ETCH OF AL, Cu, Si

SEC. A–A'

4. AFTER QUARTZ DEPOSITION & VIA HOLE PATTERN FORMATION

SEC. A–A'

5. AFTER VIA HOLE ETCH

SEC. A-A'

6. AFTER SECOND METAL EVAPORATION AND PHOTORESIST PATTERN

SEC. A-A'

7. FINAL CONFIGURATION

SEC. A-A'

METHOD FOR FORMING DENSE DRY ETCHED MULTI-LEVEL METALLURGY WITH NON-OVERLAPPED VIAS

FIELD OF THE INVENTION

The invention disclosed relates to processes for forming integrated circuit conductors, and, more particularly, relates to an etching process for metal interconnection structures in integrated circuits.

BACKGROUND OF THE INVENTION

As the density of large scale integrated circuits increases, it has been found necessary to use more than one level of metal interconnection between the transistor structures on the semiconductor chip. FIGS. 8a through 8c show the interconnection point between the first level metal line 6' and a second level metal line 20' forming a via connection. In the prior art process for forming this structure, a first layer 6 of metal such as an alloy of aluminum, copper and silicon is deposited on either a silicon substrate 2 or a silicon dioxide layer 4 and, through photolithographic techniques, the metallized line 6' is delineated. This array of first level metal lines is then covered over by a layer of sputtered quartz 12, for example, which will serve as the insulating layer between the first and second level metal lines. Then a via hole is formed in the quartz layer 12 over a section of the first level metal line 6' where an electrical interconnection between the first level and second level metal lines is designed. This is followed by the deposition of a second level metal layer 20, which, through photolithographic processes will have a second level metal line 25 delineated therein which intersects the via hole and makes the desired electrical contact with the first level metal line. In the interest of density it is desired that the second metal line not be required to totally overlap the via hole. This would require the second metal line to be sufficiently wider than the via hole in order to allow for misalignment and other process tolerances. The prior art process for forming the second level metal line is to either use a wet etching technique employing phosphoric acid or a reactive ion etching technique employing carbon tetrachloride to etch the aluminum-copper second metal layer 20. The problem which confronts the prior art is that there is no reliable way to protect the first level metal layer 6' after the second level metal layer 20 is etched through to completion. Variations in the thickness of the second level metal layer 20 due to the tolerances therein, and variations in alignment and linewidth force the process parameters to be set to etch the thickest second level metal layer which will probably be encountered. Thus, for thin layers of second level metal, the first level metal layer 6' will be overetched at 26 and 26'. By overetching, the first level metal line 6', the current being conducted through that conductor line will have a higher density at the points of lower cross-sectional area, thereby contributing to overheating, electromigration phenomema, higher contact resistance due to current crowding, all of which contribute to a reduced reliability and reduced performance for the resulting large scale integrated circuit.

OBJECTS OF THE INVENTION

It is therefore an object of the invention to provide an improved conductor structure for a large scale integrated circuit.

Still another object of the invention is to provide a more reliable double level metal interconnection structure for a large scale integrated circuitry.

It is still a further object of the invention to provide double level metallurgical interconnection having non-overlapped vias, which is more reliable than the prior art.

SUMMARY OF THE INVENTION

These and other objects, features, and advantages of the invention are provided by the dense dry etched multi-level metallurgy with non-overlapped vias disclosed herein.

A double level metal interconnection structure and process for making same are disclosed, wherein an etch-stop layer is formed on the first metal layer to prevent overetching thereof when forming the second level metal line in a via hole in an insulating layer thereover, by means of reactive plasma etching. The etch-stop layer is composed of chromium and the reactive plasma etching is carried out with a halocarbon gas.

DESCRIPTION OF THE FIGURES

These and other objects, features and advantages of the invention will be more fully appreciated with reference to the accompanying figures.

FIGS. 1a through 7a illustrate a plan view of a non-overlapped via site in a double level metallurgical interconnection structure, for the sequence of fabrication steps in the inventive process.

FIGS. 1b through 7b correspond, respectively, with FIGS. 1a through 7a, and show the corresponding cross-sectional view along the section line a-a'.

FIG. 8b is a cross-sectional view along the section a-a' of FIG. 8a.

FIG. 8c is a cross-sectional view along the section b-b' of FIG. 8a.

FIG. 9b is a cross-sectional along the section line a-a' of FIG. 9a.

FIG. 9c is a cross-sectional view along the section b-b' of FIG. 9a.

DISCUSSION OF THE PREFERRED EMBODIMENT

A new double level metal interconnection structure and process are disclosed, wherein an etch-stop layer is formed on the first metal layer to prevent overetching thereof when forming the second level metal line in a via hole in an insulating layer thereover, by means of reactive ion etching or wet etching.

FIGS. 1a through 7a show a plan view of the intersection of a first level line and second level line in a double level metallurgical non-overlapped via structure. FIGS. 1b through 7b show corresponding cross-sectional views of the structures in FIGS. 1a through 7a, respectively, along the section line a-a'.

Non-overlapped via hole construction in a double level metallurgical structure is the use of a second level metal line whose width is less than or equal to the diameter of the via hole through which it must pass to make contact with the first level metal line. Such a structure allows a higher compaction density for metal line in the LSI layout, but suffers from the prior art problem of inadvertent overetching of the first level metal line as was discussed above.

Figure 1A:
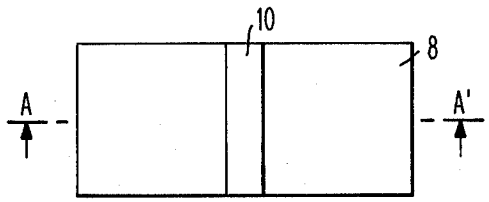
Figure 1B:
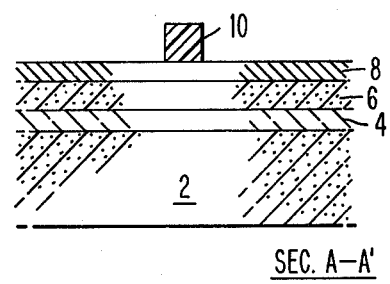

FIGS. 1a and 1b show the first stage in the formation of the double level interconnection, where a layer of silicon dioxide 4 is of approximately 2000 to 5000 Angstroms in thickness formed on the surface of the silicon substrate 2. This is followed by the evaporative deposition of an 8000 Angstrom thickness of a first level metal layer 6 which may be composed of an alloy of 95% aluminum, 4% copper and 1% silicon.

A central element in the inventive concept disclosed herein is the evaporative deposition of 2000 Angstroms thick layer of chromium 8 which will serve as an etch-stop barrier to protect the metal layer 6 during subsequent processing steps.

This is followed by the formation of a pattern layer of photoresist 10, which will delineate the longitudinal shape of the first level metal line formed in the layer 8.

Figure 2A:
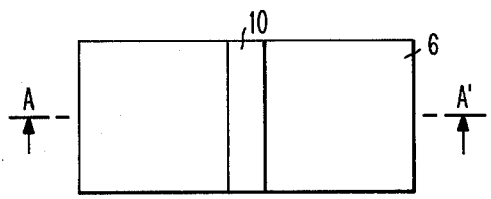
Figure 2B:
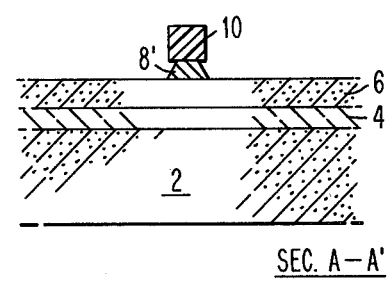

FIGS. 2a and 2b show the next stage in the formation of the interconnection between the double level metal layers where $CF_4 + 10\%$ $O_2$ plasma maintained at a pressure of approximately one torr is employed in a plasma etching chamber to delineate the longitudinal shape of the first level metal line in the chromium layer 8 forming a chromium strip 8'.

Figure 3A:
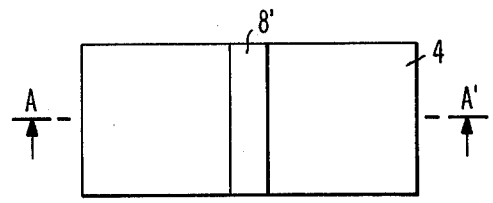
Figure 3B:
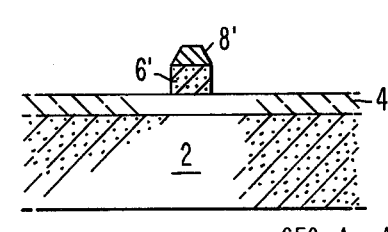

FIGS. 3a and 3b show the next stage where the aluminum copper silicon alloy layer 6 is etched by reactive ion etching using carbon tetrachloride plus argon (40–60 mixture) at an elevated temperature in excess of 180° C. with the workpiece held at approximately −200 volts potential, to delineate the longitudinal shape of the first level metal line 6' in the first level metal layer 6. This is followed by removing the patterned photoresist layer 10 by an ashing process using an r.f. plasma of 20% $O_2$ and 80% $N_2$ at one torr.

Figure 4A:
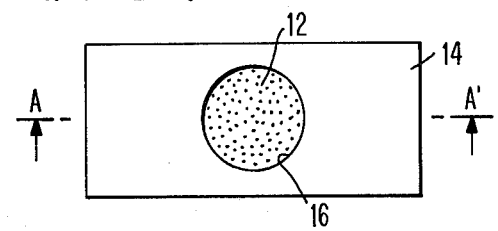
Figure 4B:
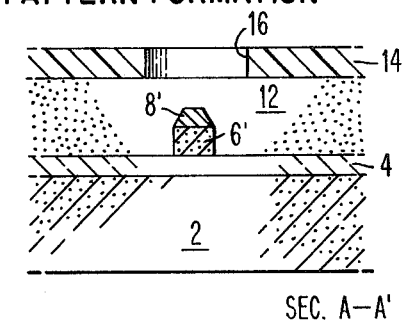

FIGS. 4a and 4b show the next stage where a 22,000 Angstrom thick layer of planar quartz 12 is deposited around and over the first level metal line comprised of the layers 6' and 8'. This is followed by the formation of a photoresist layer 14 having a patterned hole 16 located over the first level metal line 6' at a point where the via interconnection structure is desired to be formed.

Figure 5A:
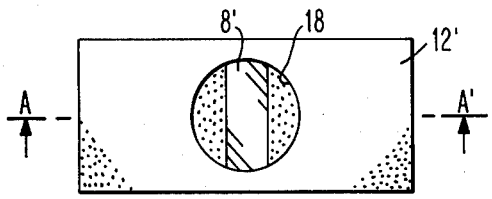
Figure 5B:
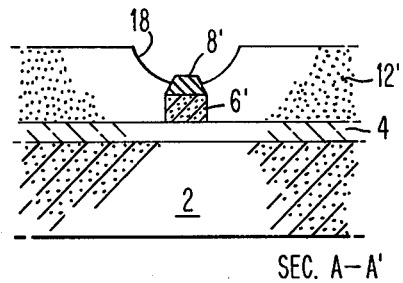

FIGS. 5a and 5b show the next step of forming the via hole depression 18 in the quartz layer 12 by means of a carbon tetrafluoride and 8% oxygen plasma etch mixture, maintained at a pressure of approximately one torr in a plasma etching chamber. Thereafter, the photoresist layer 14 is removed.

Figure 6A:
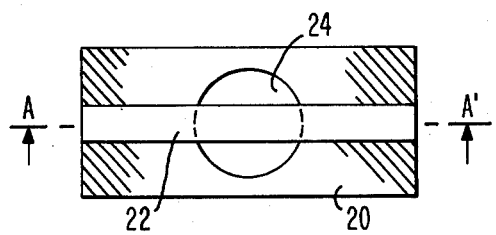
Figure 6B:
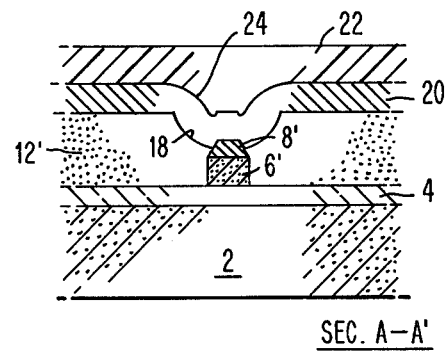

FIGS. 6a and 6b show the next stage of depositing layer 20 of an alloy of 95% aluminum and approximately 5% copper to a thickness of 10,000 Angstroms to 12,000 Angstroms on the surface of the quartz layer 12', the layer 20 following the contour of the quartz in the via hole 18 forming a depressed portion 24. The layer 20 will be the second level metal layer for the double level structure. A layer of photoresist 22 is deposited on the surface of the second level metal layer and patterned to delineate the second level metal line 20' which will intersect the first level metal line 6' in the via hole 18.

Figure 7A:
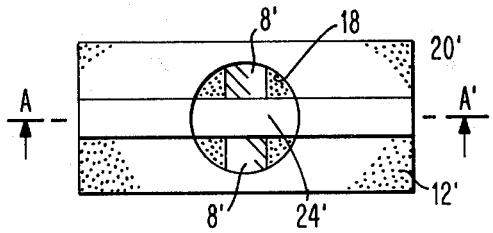
Figure 7B:
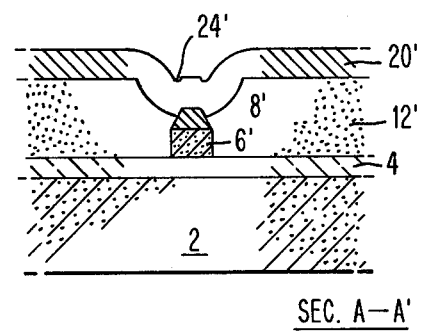
Figure 8A:
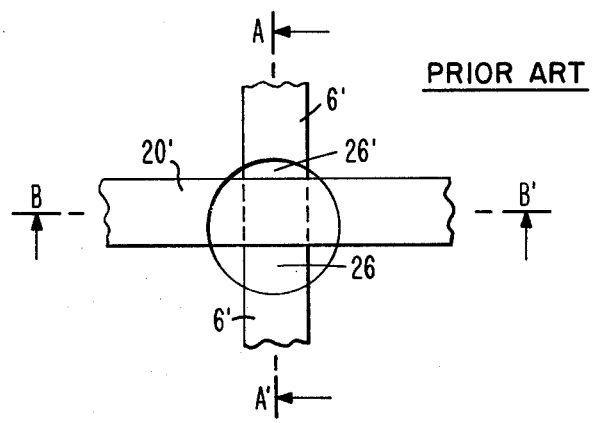
FIG. 8a shows a plan view of the prior art non-overlapped via interconnection for double level metallurgical structure.
Figure 8C:
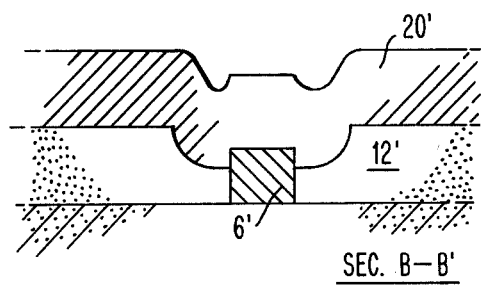
Figure 8B:
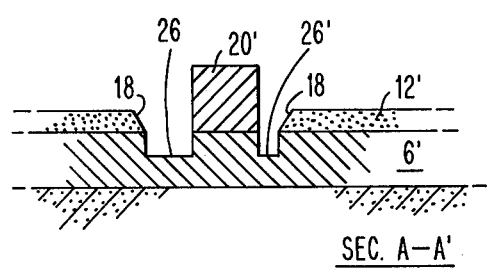
Figure 9A:
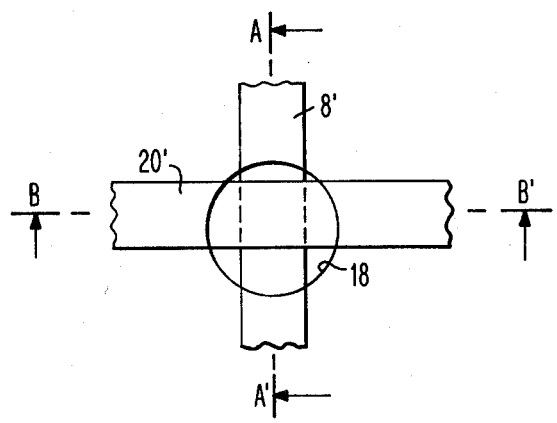
FIG. 9a shows another plan view of the non-overlapped via double level metallurgical structure for the invention.
Figure 9C:
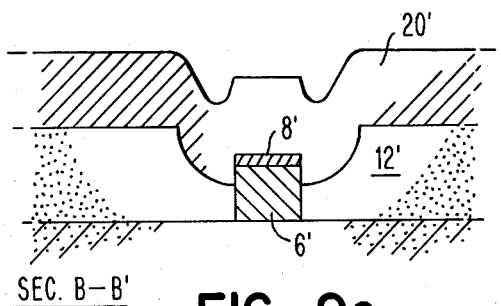
Figure 9B:
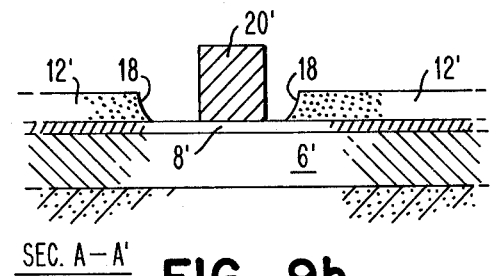

FIGS. 7a and 7b illustrate the next stage where reactive ion etching is carried out with carbon tetrachloride-argon mixture at an elevated temperature of at least 180° C., to etch the second level metal line 20'. The portion 24' of the second level metal line 20' which passes through the via hole 18 makes electrical and mechanical contact with the first level metal line 6', 8'. By virtue of the coverage of the chromium etch-stop layer 8' over the first level metal line 6' composed of aluminum copper silicon alloy, overetching of the first level metal line 6' by the reactive ion etching step is avoided because the chromium etch rate is 1/6 of the aluminum-copper-silicon etch rate. In addition, the quartz etch rate is approximately 1/10 that of the aluminum copper etch rate in the reactive ion etching step. The use of the chromium layer 8' protects the first level metal layer 6' from attack by the reactive ion etching step and the quartz layer 12', which is exposed is negligibly attacked. Thus, the resulting first level metal line 6' does not suffer from overetched regions of reduced cross-sections which contribute to a reduced reliability, or operating characteristics, as has been experienced in the prior art.

In an alternate embodiment, a wet etching step may be substituted for the reactive ion etching step to etch the second level metal line 20' as is shown in FIGS. 7a and 7b. For example, a phosphoric and nitric acid mixture may be employed to etch the aluminum copper second level metal layer 20'. The acid has a substantially reduced etch rate for chromium and therefore the protective chromium layer 8' serves as an etch-stop to protect the underlying first level metal line 6' during the wet etching process using phosphoric acid. The use of a wet etching technique, however, has the detriment that it tends to undercut the aluminum copper silicon metal in the first level metal line 6' beneath the protective chromium layer 8', tending to reduce the effective current carrying cross-sectional area for the conductor. However, in those applications where such a longitudinally uniform reduced cross-sectional area for first level metal line can be tolerated, the use of a wet chemical technique such as this may be employed.

It should be noted that the use of a chromium layer 8' as the etch-stop for the first level metal line 6' has an additional advantage in that it more reliably defines a desired conductor width by forming a mask having a stable transverse dimension during the etching process for the first level metal line. The prior art technique of using a photoresist mask to delineate the shape of the first level metal line 6' with its tendency to melt away during the reactive ion etching step, results in a tapered contour for the etched lateral sides of the underlying first level metal line 6'. This problem is avoided when a mechanically stable chromium 8' is employed as a masking layer on the surface of the first level metal line 6' during the reactive ion etching step.

The etch-stop layer 8 may be composed of refractory transition methods other than chromium, such as $T_i$, Zr, V, Nb, Ta, W, Mo, Pt, Pd and Ni.

As was previously discussed, the first level metal layer 6 is saturated with silicon to prevent diffusion of silicon atoms out of the substrate at points of contact with the metal layer 6, as in Schottky Barrier Diode contacts or shallow emitter contacts. However, when the second level metal line 20 which may be composed of an alloy which is not saturated with silicon, is placed in contact with the first level metal 6, subsequent heating steps can induce the diffusion of silicon atoms out of the first level metal layer 6 into the second level metal layer 20, reducing the concentration of silicon in the metal layer 6 and thus causing undesired diffusion of silicon atoms from the silicon substrate into the metal layers 6 and 20. This situation can be prevented by the deposition of the chromium layer 8 in accordance with the invention discussed above, which will serve as a diffusion barrier preventing the unwanted diffusion of silicon atoms from the metal layer 6.

While the invention has been particularly shown and described with reference to the preferred embodiments thereof, it will be understood by those skilled in the art that the foregoing and other changes in form and detail may be made therein without departing from the spirit and scope of the invention.

We claim:

1. A process for forming on a substrate a double level metal interconnection having an etch-stop on the conductor line on a first level metal to prevent overetching thereof when forming a second level metal line in a via hole thereover, comprising the steps of:

depositing a first level metal layer on said substrate;

depositing a layer of refractory metal on the surface of said first level metal layer;

depositing a pattern layer of photoresist on said layer of refractory metal to mask the longitudinal shape of said conductor line to be formed in said first level metal layer;

etching said layer of refractory metal and said first level metal layer exposed through said pattern layer of photoresist, forming said conductor line in said first level metal layer covered by said etch-stop;

forming an insulating layer over said first metal level conductor lines with a via hole through said insulating layer;

forming a patterned second level metal layer on said insulating layer and in said via hole with an etching process which has a reduced etch rate for said refractory metal;

whereby said refractory layer forms an etch-stop on said first metal level conductor line for said etching process.

2. The process of claim 1, wherein said etching process is a reactive ion etching process.

3. The process of claim 2, wherein said refractive metal layer is chromium.

4. The process of claim 1, wherein said etching process employs an etchant of a phosphoric acid and nitric acid mixture.

5. The process of claim 4 wherein said refractive metal layer is chromium.

6. The process of claim 1, wherein, said substrate is silicon and said second level metal line is not saturated with silicon atoms, so that said layer of refractory metal forms a diffusion barrier for silicon atoms.

* * * * *